United States Patent [19]

McAnney

[11] Patent Number: 4,503,537
[45] Date of Patent: Mar. 5, 1985

[54] PARALLEL PATH SELF-TESTING SYSTEM

[75] Inventor: William H. McAnney, Fishkill, N.Y.

[73] Assignee: International Business Machines Corporation, Armonk, N.Y.

[21] Appl. No.: 440,065

[22] Filed: Nov. 8, 1982

[51] Int. Cl.³ .............................................. G06F 11/00
[52] U.S. Cl. .................................. 371/25; 324/73 R; 364/900
[58] Field of Search .................. 364/900, 200; 371/25, 371/38, 16, 15, 20; 324/73 R, 73 AT

[56] References Cited

U.S. PATENT DOCUMENTS

| | | | |
|---|---|---|---|
| 4,051,353 | 9/1977 | Lee | 364/900 X |
| 4,071,902 | 1/1978 | Eichelberger et al. | 364/900 X |
| 4,192,451 | 3/1980 | Swerling et al. | 371/20 |
| 4,225,957 | 9/1980 | Doty et al. | 371/25 X |
| 4,244,048 | 1/1981 | Tsui | 371/15 |
| 4,298,980 | 11/1981 | Hajda | 371/25 |
| 4,312,066 | 1/1982 | Bantz et al. | 371/16 |
| 4,340,857 | 7/1982 | Fasang | 371/25 X |
| 4,342,084 | 7/1982 | Sager et al. | 371/38 X |
| 4,377,757 | 3/1983 | Könemann et al. | 307/303 |
| 4,428,060 | 1/1984 | Blum | 364/715 |

OTHER PUBLICATIONS

Eichelberger et al., "A Logic Design Structure for LSI Testability", Proceedings of the 14th Design Automation, pp. 462-468, Jun. 1977.
Feretich et al., "LSSD Serializer", IBM Technical Disclosure Bulletin, p. 5414, May 1980.
Konemann et al., "Built-In Logic Block Observation Techniques", 1979 IEEE Test Conf., pp. 37-41, Oct. 1979.
Hayes, "Testing Logic Circuits by Transition Counting", FTCS-5, pp. 215-219, Jun. 1975.
Frohwerk, "Signature Analysis: A New Digital Field Service Method", Hewlett-Packard Journal, vol. 28, pp. 2-8, May 1977.
Konemann, "Built-in Test for Complex Digital Integrated Circuits", IEEE J. Solid-State C., vol. SC-15, No. 3, pp. 315-319, Jun. 1980.
Stahuke, W., "Primitive Binary Polynomials", Comput., vol. 27, No. 124, pp. 977-980, Oct. 1973.
Hsiao, M. Y., "Generating PN Sequences in Parallel", Proceedings 3rd Annual Princeton Conf., Information Sciences and Systems, Mar. 1969.

Primary Examiner—Jerry Smith
Assistant Examiner—Michael R. Fleming
Attorney, Agent, or Firm—James E. Murray

[57] ABSTRACT

The LSSD scan paths of each logic circuit chip on a circuit module are connected to additional test circuit chips on the same module. The test chips contain a random signal generator and data compression circuit to perform random stimuli signature generators and also contain switching circuits to connect the scan paths of the chips in parallel between different stages of the random signal generator and the data compression means for random stimuli signature generators and to disconnect the scan paths from the signal generator and data compression circuitry and arrange them serially in a single scan path to perform other tests.

3 Claims, 8 Drawing Figures

FIG. 6
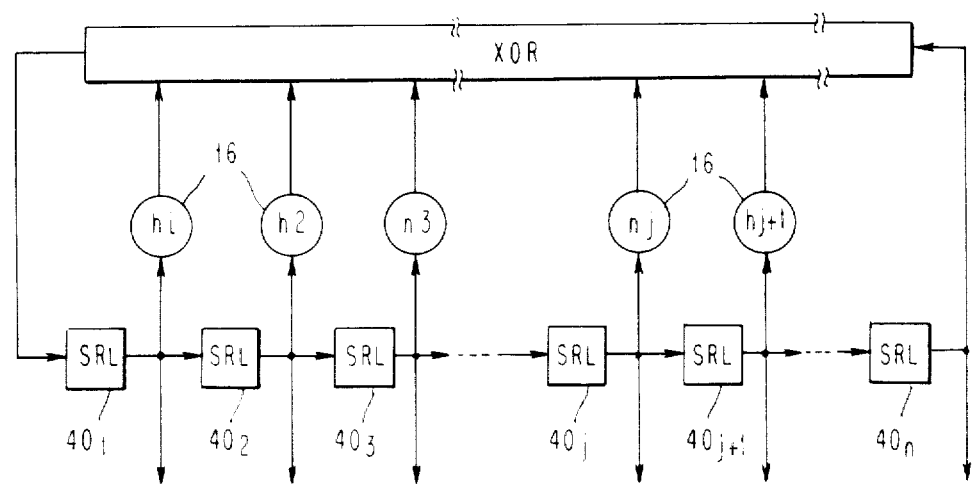
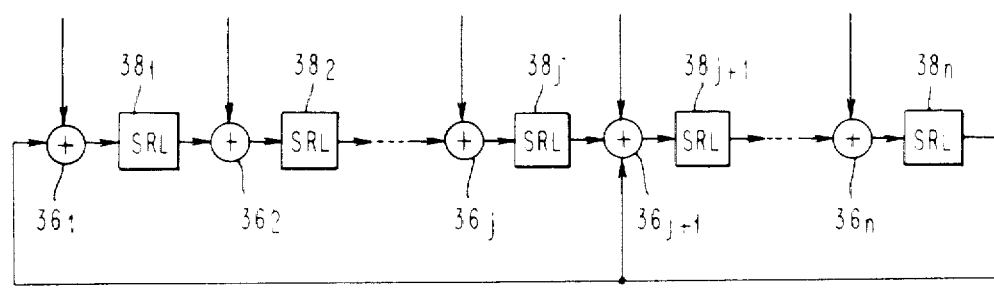
FIG. 7

PARALLEL PATH SELF-TESTING SYSTEM

BACKGROUND OF THE INVENTION

1. Field of Invention

The present invention relates to testing of complex combinatorial and sequential logic circuits embodied in large scale integration (LSI) and very large scale integration (VLSI) circuit devices.

2. Description of Prior Art

A fault occurring anywhere in such a LSI or VLSI circuit device can have its effect propagated through a number of feedback loops formed of storage or memory elements in the sequential logic before reaching a testable output of the device. Level sensitive scan design (LSSD) rules were devised to eliminate the complications in testing caused by this propagation through the feedback loops. As described by E. B. Eichelberger and T. W. Williams in an article entitled "A Logic Design Structure for LSI Testability" on pages 462–468 of the Proceedings of the 14th Design Automation Conf., LSSD rules impose a clocked structure on the memory elements of logic circuits and require these memory elements be tied together to form a shift register scan path so that the memory elements are all accessible for use as both a test input or output point. Therefore, with the scan path, test input signals can be introduced or test results observed wherever one of the memory elements occurs in the logic circuit. Being able to enter the logic circuit at any memory element for introducing test signals or observing test results, allows the combinational and sequential logic to be treated as much simpler combinational logic for testing purposes thus considerably simplifing test generation and analysis.

Single or multiple scan paths can be provided under the LSSD rules. It has been suggested in an article by R. A. Feretich appearing on page 5414 of the May 1980 issue of the IBM Technical Disclosure Bulletin that control means can be provided for LSSD scan circuits to switch between single or multiple path modes of operation.

In using LSSD, a single stuck-fault model is used to generate the test patterns applied to the circuit, and output responses are collected after each test for comparison with the precalculated "good circuit" responses. It has been shown that such stuck-fault test generation is one of a class of difficult mathematical problems called NP-complete, where NP stands for non-deterministic polynomial time and complete meaning that a solution for one problem in the class could be extended to all. In all NP-complete problems the number of possible solutions grows spectacularly as the size of the problem increases. Therefore, the implication is that test generation computer times increase exponentially with the size of the circuit. In view of this, it appears that the best stuck fault test algorithms are only computationally feasible for fairly small or fairly simple networks and fault-oriented approaches become prohibitively expensive with the increasing circuit density of VLSI chips and modules.

It has been previously suggested that self-testing be employed in connection with LSSD to reduce the time it takes to generate the test patterns and to perform the testing. Self-testing involves the use of pseudo-random pattern generators and response compression structures that are built into logic circuit devices. Using such pattern generators and compression structures eliminates the computer time needed to generate the tests while placing these testing elements on the device containing the logic allows the application of vast numbers of test patterns to the circuits in a reasonable period of time. Potential compression methods for use during these testings include transition counting, as suggested by J. P. Hayes in an article entitled "Testing Logic Circuits by Transition Counting", FTCS-5, pages 215–219, June 1975, and more recently, signature analysis, as described by R. A. Frohwerk in "Signature Analysis: A New Digital Field Service Method", Hewlett-Packard Journal, Vol. 28, pages 2–8, May 1977.

Konemann, Mucha, and Zwiehoff describe incorporating the structure necessary to perform random stimuli signature analysis into the circuit device being tested in their papers "Built-in Logic Block Observation Techniques", 1979 IEEE Test Conf., pages 37–41, Cherry Hill, N.J., October 1979 and "Built-in Test for Complex Digital Integrated Circuits", IEEE J. Solid-State C., Vol. SC-15, No. 3, pages 315–319, June 1980. In the Konemann et al articles a shift register scan path is reconfigured to form a serially connected linear feedback shift register (LSFR) circuit that operates either as a random input signal generator or as a data compression circuit to perform self-test signature analysis. One of the circuits operates as an input signal generator while another of these circuits operates as an output response compressor. During a later test their roles may be reversed. However, at no point does either LFSR circuit simultaneously perform both the input and output functions during the self-test.

In co-pending patent application Ser. No. 440,070, filed on even date herewith and entitled "Simultaneous Self-Test", an LFSR circuit simultaneously performs both input and output functions during self-testing.

SUMMARY OF THE INVENTION

In accordance with the present invention a new configuration is provided to perform self-testing in circuits designed with LSSD rules. In this new configuration, the LSSD scan paths of each of the logic circuit chips on a circuit module are connected to additional test circuit chips on the same module. The test circuit chips contain the pseudo-random signal generator, the data compression circuit, and the switching circuits which connect the scan paths in parallel between different stages of the random signal generator and the data compression means for self-test, and connect the scan paths together in series for other testing procedures. The additional test circuitry circuit requires one input signal to the module to cause the switching between the two testing configurations. Signature generation is accomplished using the same clocks as the LSSD circuits. Furthermore, signature testing is accomplished using a minimum of additional circuitry.

Therefore, it is an object of the present invention to provide a new circuit configuration for performing self-testing.

It is another object of the invention to provide self-testing using LSSD design rules and circuits.

It is a further object of the invention to perform self-testing using LSSD design rules with a minimum of additional circuitry.

BRIEF DESCRIPTION OF THE DRAWINGS

These and other objects of the invention are best understood by reference to the accompanying figures illustrating the embodiment of the invention of which:

FIG. 6 is a logic diagram of the random signal generator employed in FIG. 4;

FIG. 7 is a logic diagram of the data compression device of FIG. 4;

ILLUSTRATED EMBODIMENT

Figure 1:
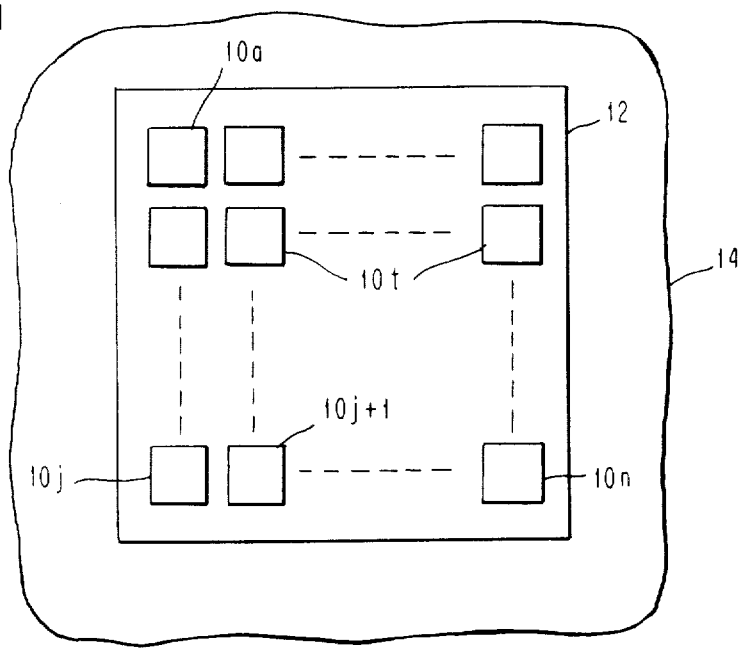
FIG. 1 is a plan view of a circuit module.

In FIG. 1, a plurality of semiconductor logic circuit chips 10 are arranged on the topside of a substrate 12 and interconnected by wiring nets within the substrate 12 to perform logic functions. The underside of the substrate 12 contains connecting pins which plug into a circuit board 14 which holds a plurality of such substrates 12 interconnected by wiring nets within the board 14.

Figure 2:
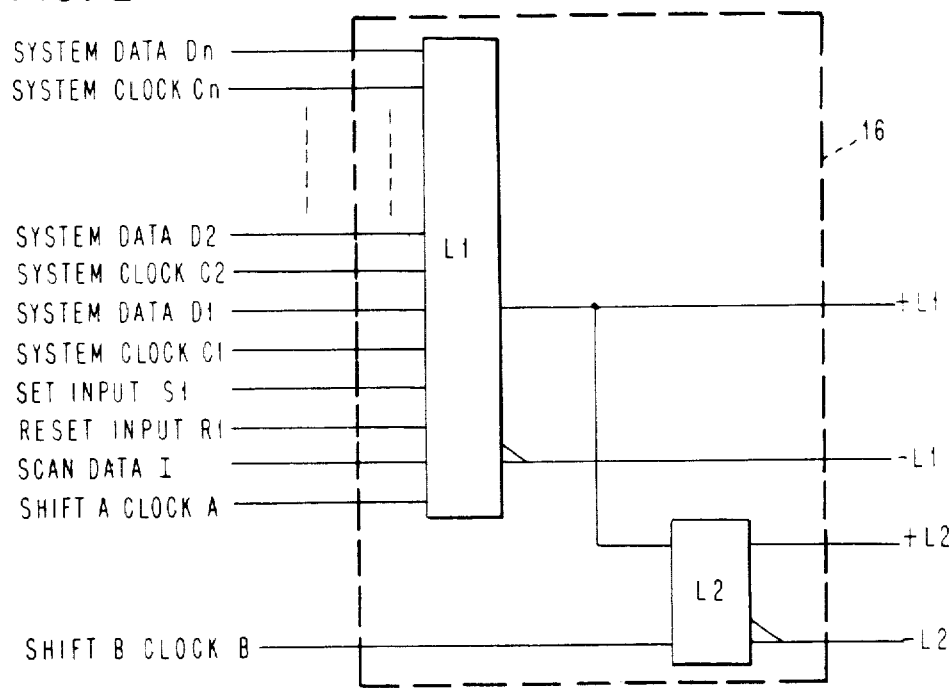
FIG. 2 is a circuit diagram of a typical LSSD shift latch.

The memory elements or circuits on the circuit chips are all shift register latches (SRLs). As shown in FIG. 2, an SRL contains two latches: a data input latch (L1) and a second latch (L2) for use in system or shift register operation.

Latch L1 is fed by one or more system clocks ($\pm C$), polarity hold data inputs ($\pm D$), set inputs ($\pm S$), reset inputs ($\pm R$), scan data inputs ($\pm I$) and shift-A clock inputs ($\pm A$). Latch L2 is fed only by latch L1 and shift-B clock inputs ($\pm B$).

System data outputs may be taken from latch L1 ($\pm L1$), from latch L2 ($\pm L2$) or from both latch L1 and latch L2. At least one output from latch 2 must be used to provide a shift register data or scan path for testing purposes. All SRLs on a logic circuit chip 10 of FIG. 1 are connected together in one or more scan paths.

The system clocks ($\pm C_i$ and/or $-C_i$ inputs) control the corresponding system data inputs ($\pm D_i$, $\pm S_i$, $\pm R_i$, $\pm$Extend$_i$) such that when each system clock is in its "off" state, none of these data inputs can affect the data stored in latch L1. When a system clock is "on" and the other system clocks and the shift-A clock are "off", the corresponding system data inputs determine the state of latch L1.

When the shift-A clock is "on" and the system clocks are "off", the scan data input(s)($\pm I$) will determine the state of latch L1.

When the shift-B clock is "on", latch L2 will assume the data stored in latch L1.

When the shift-A clock is "on", and the shift-B clock is "on", and the system clocks $C_i$ are "off", then the L1 and L2 latches will follow the value of the scan data input(s) ($\pm I$).

Logic circuits on the chips 10 are designed using level sensitive scan design rules or constraints. Thus, all the SRLs 16 on a chip form a shift register scan path 18 with an input and output independent of the logic function inputs and outputs on the chip so that data can be entered and moved through this path independently of data inputs and outputs. Furthermore, the SLRs 16 are separated from each other by combinatorial logic circuits 20. As pointed out above, this arrangement of separate scan paths for testing and separation of latches 16 allows complex sequential and combinatorial logic circuits to be analyzed as simpler combinatorial logic circuits 20 with latch circuit inputs and outputs.

Figure 4:
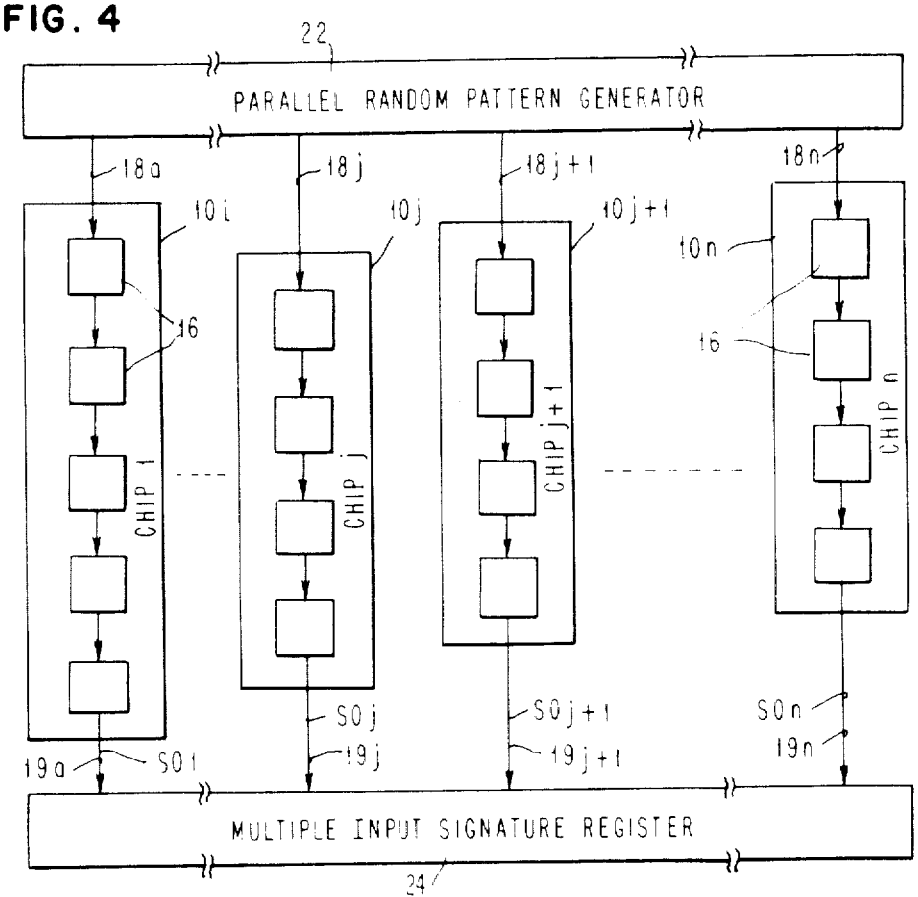
FIG. 4 is a block diagram of the arrangement of scan paths of FIG. 3 in accordance with the present invention.
Figure 5:
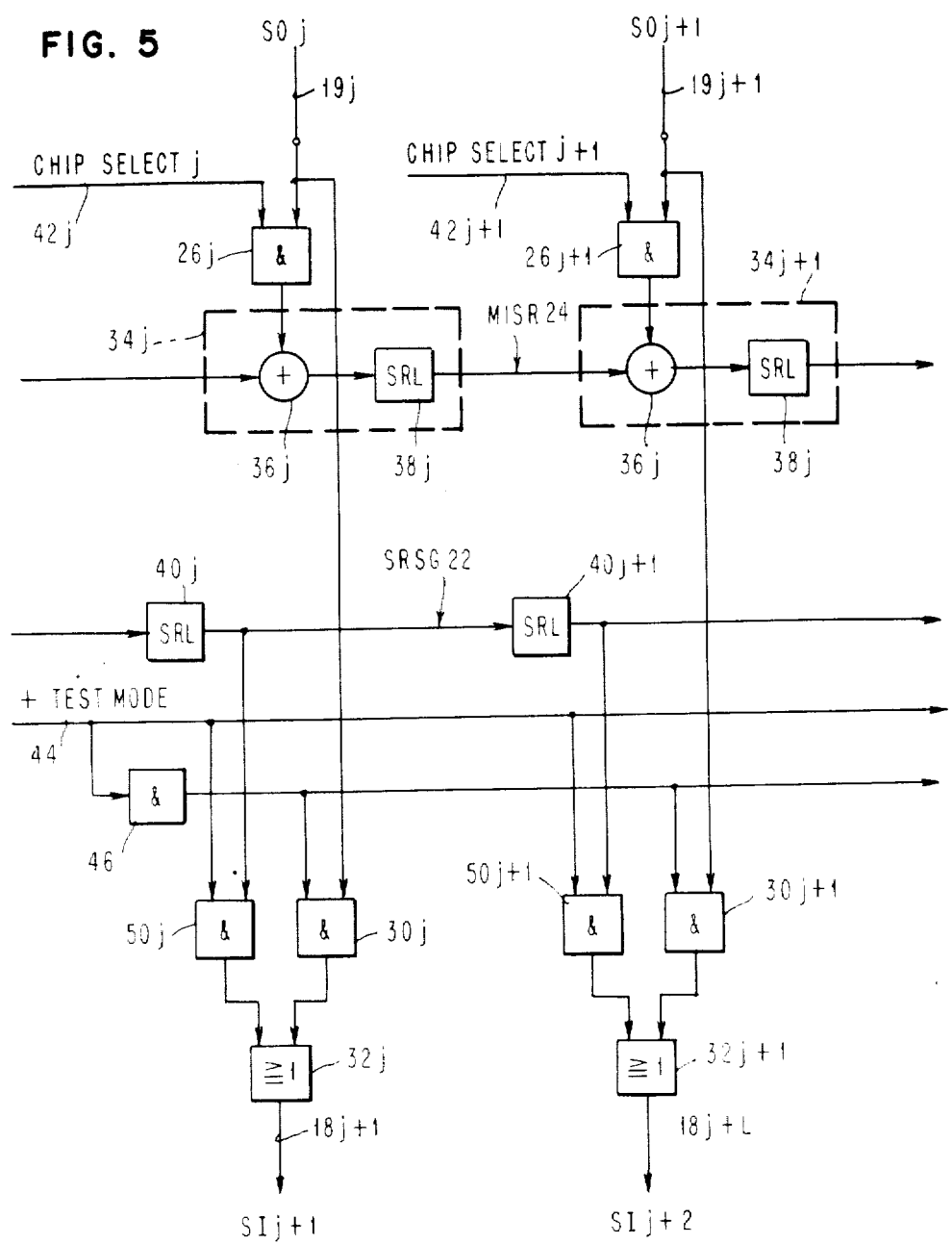
FIG. 5 is a circuit diagram of two stages of the random signal generator and data compression circuitry used in FIG. 4.

As pointed out above, it is very desirable to be able to perform self-testing using random stimuli and signature analysis in this environment of logic circuits having LSSD scan paths. As shown in FIG. 4, this is accomplished by providing a pseudo-random pattern generator also called a shift register sequence generator (SRSG) 22 and a multiple input signal register (MISR) 24 which are arranged on one or more chips 10t on the substrate in module 12. The circuit diagram of any two intermediate stages, j and j+1 of SRSG 22 and MISR 24 are shown in FIG. 5. Though only two stages are shown, all stages are identical and function to connect the scan paths 18 of the chips 10a to 10n in parallel between them and provide test sequences and collect and compress data for self-test signature analysis.

As shown in FIGS. 4 and 5, the output 19j of the scan path 18 of chip 10j is fed through an AND circuit 26j to an exclusive OR circuit 36j of the MISR 24 and also to an AND circuit 30j which couples the input through an OR circuit 32j to the scan input SI j+1 for the scan path 18 j+1 of the next chip 10j+1.

Each stage 34 of the MISR 24 contains an exclusive OR circuit 36 and an SRL 38 connected in series. The n stage MISR also contains a feedback loop which connects the nth stage of the MISR with the first stage of the MISR so that data in the output stage is wrapped around and fed through the input stage as data is stepped from stage to stage through the MISR. Configuration for such a MISR is shown in detail in FIG. 7. In a typical application n would be equal to 100 or more providing an n digit signature.

The SRSG also contains a SRL 40 for each chip 10 on the substrate. These SRL stages are connected together into a linear feedback shift register LSFR such as shown in FIG. 6 where hi represents a connection or a lack of connection to implement a primitive polynomial (see "Primitive Binary Polynomials" by W. Stahuke, Math. Comput. Vol. 27, No. 124, pages 977-980, Oct. 1973 for a listing of primitive polynomials through degree 168). Such a shift register generates an n digit Galois field sequence of $2^n-1$ numbers in which no number is repeated in the sequence. The actual length of the sequence and the number of digits in the number will depend on the number of stages in the shift register or in other words the number of chips 10 on the substrate. This typically would be more than 100 chips. The SRLs 38 and 40 are scan-only SRLs similar to the ones shown in FIG. 2 without the system data inputs. Other SRSG configurations are possible such as the LFSR described in a publication by M. Y. Hsiao entitled "Generating PN Sequences in Parallel", Proceedings 3rd Annual Princeton Conf., Information Sciences and Systems, Mar. 1969.

The control terminals for the self-test chips 10t include a different chip select terminal 42 connected to each AND circuit 26 and a single test mode terminal 44 which is connected to AND gates 50 through an inverter 46 to the AND gates 30. Thus, with all chip select inputs 42 down and test module input 44 down the scan paths 18 of all the chips are connected together in a series circuit by connections 50. With all the chip select inputs 42 up and the test mode input up the scan paths 18 of all the chips in the module 12 are connected in parallel between the SRSG 22 and the MISR 24 for the self-test procedure. Various individual chip select inputs 42 are left down while the test mode input is up to deselect scan paths of certain chips from the self-test calculation for diagnostic purposes.

Figure 3:
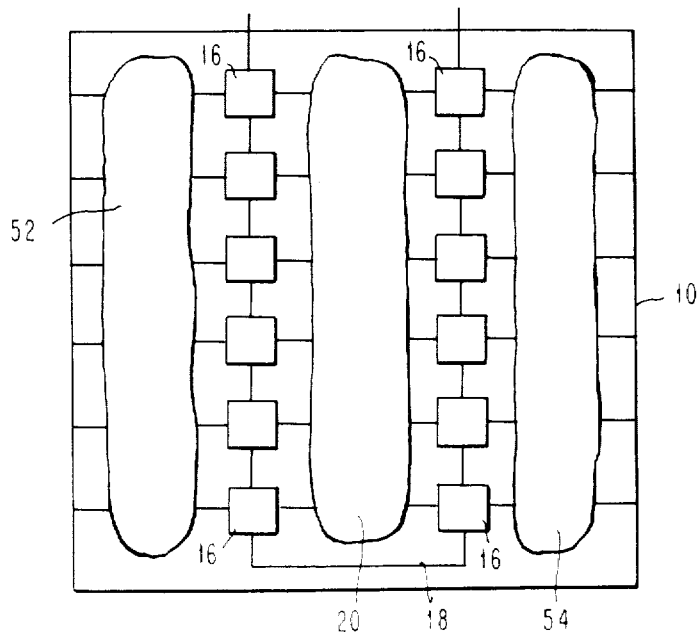
FIG. 3 is a schematic of a circuit chip containing a scan path of LSSD shift register latches.

In the chip shown in FIG. 3, the latches 16 in the scan path 18 are used to test the combination of logic circuits 20 that are bounded by SRLs 16 so that inputs supplied from one SRL affect outputs taken from another or other SRLs. Circuits 52 and 54 that either have no SRL inputs or SRL outputs on the chip receive such SRL inputs or outputs from other chips on the substrate. However, when this analysis is extended to the substrate 12, certain portions of the circuitry on the substrate has no test circuitry coverage.

Figure 8:
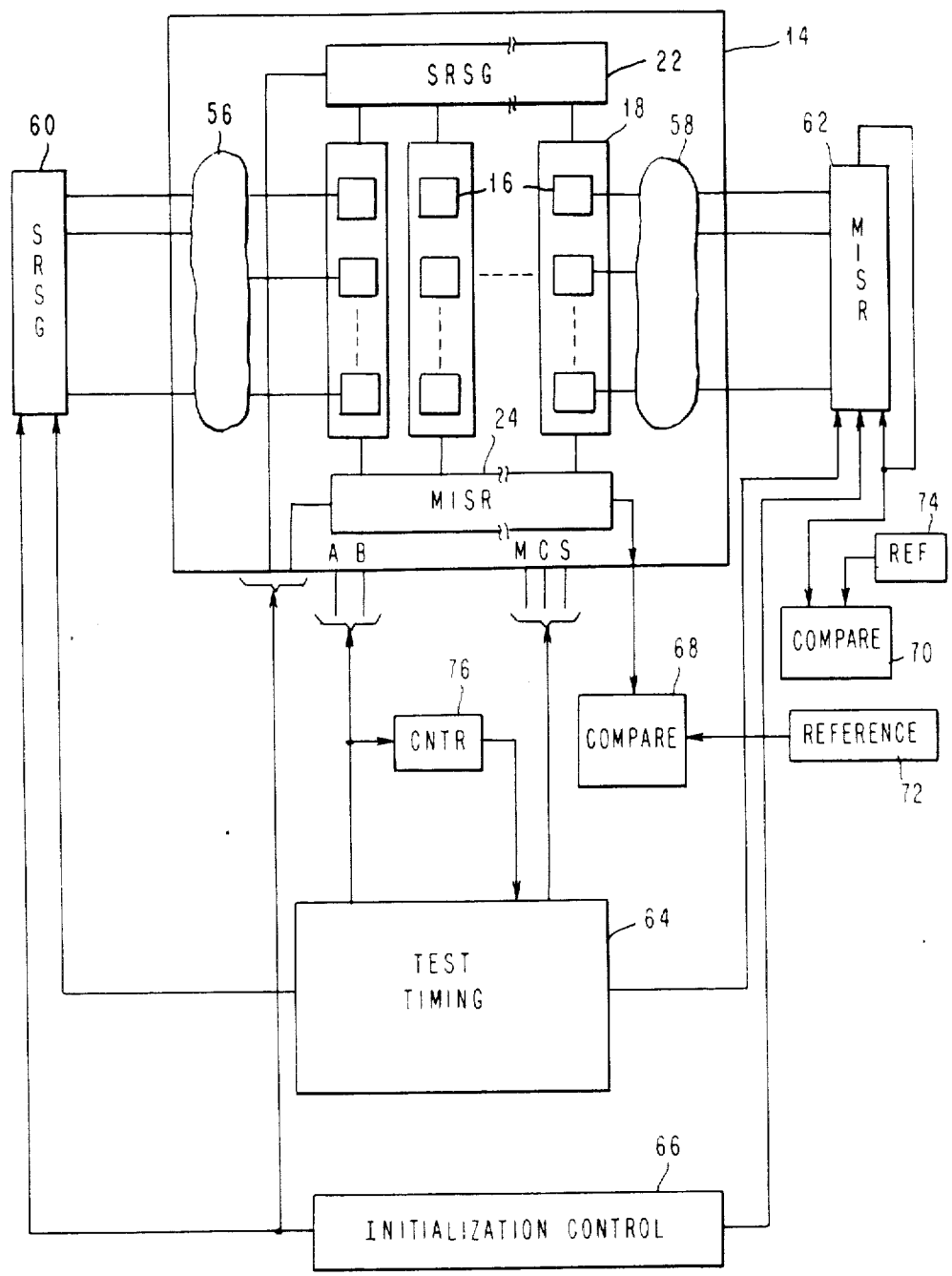
FIG. 8 is a schematic of a tester fixture employed with the present invention.

As shown in FIG. 8 portions 56 and 58 of the circuitry on the module is not fully covered by the MISR, LFSR, and the SRLs on the module. For this reason a testing socket is provided for the module which includes circuits to give complete coverage to the module when it is tested outside a system environment.

The primary input pins (PIs) of the module are driven by an additional pseudo-random binary number generator 60 and test responses from circuits 58 are compressed by an additional multiple input signature register (MISR) 62.

The new SRSG and MISR are configured the same as the LSFR 22 and the MISR 24. The SRSG feeds random test signals to the module 14 inputs and the MISR 62 compresses responses. The test socket also includes a timing signal generator 64 to run the machine clocks (MCs), the shift clocks AB, and the clocks for the SRSG 60 and the MISR 62. Also controls 66 are provided to initialize the MISRs 24 and 62, the SRSGs 22 and 60, and the SRLs 16. Finally, comparison means 68 and 70 are provided to make separate comparisons between the outputs of MISRs 24 and 62 and the stored values 72 and 74 representing the signatures of a good module.

In the self-test mode of operation, the LSSD shift clocks ±A and ±B drive in common the parallel SRSG 22, the SRLs 16, and the MISR 24. The SRLs 16 are loaded with pseudo-random patterns from the parallel SRSG 22 using the A and B shift clocks. The SRSG 60 is clocked one or more times to drive the module inputs with a new pseudo-random pattern. Then the machine clocks (MCs) are cycled to capture the logic responses to the patterns in the SRLs 16, and the MISR 62 is clocked once to capture the responses on the module outputs. The SRLs 16, now containing test results, are again exercised using the AB clocks to unload their contents in parallel into the MISR 24 while SRSG 22 is simultaneously loading the next set of pseudo-random patterns into the SRLs. A test pass or fail indication is obtained after the last test by comparing the signature remaining in the MISRs 24 and 62 with the expected signatures 72 and 74 in compare circuits 68 and 70.

The number of SRLs 16 on each logic chip of the module will vary and some logic chips may not have any. The number of shift clock cycles required in test mode to load all the SRLs 16 on the module is equal to the number of SRLs 16 in the longest shift-register string scan path 18 on any of the logic chips 10. This will cause the random patterns being loaded into the shorter scan path to overflow into the MISR but will not affect the correctness of the final MISR signature. A logic chip with no SRLs must contain pure combinational logic and is tested by stimuli provided by its surrounding chips.

Before such testing can begin the module must be initialized. Initializing means getting the module and the test socket into a repeatable (if not necessarily known) state ready to begin self-testing. After powering up the module and the test socket circuitry, a repeatable pattern is loaded into all the SRLs in the module. An acceptable procedure to load the repeatable pattern is to apply a constant logical 1 on the shift-register scan-in pin of the module and to run enough AB clock cycles to load the string. Alternatively the SRLs can be set to a repeatable state using a Flush operation in which both shift clocks A and B are held on and the logical value on the scan-in primary input is flushed through the string. The MISR and the SRSG on the test chip(s) are similarly initialized using their scan paths. The MISR may be initialized with any pattern (even all zeros) but the SRSG must be loaded with a non-zero pattern. Finally the socket electronics, the SRSG driving the module inputs, and the MISR driven by the module outputs are initialized, again with any MISR pattern and a non-zero pattern on the SRSG. The key to initialization is not in knowing the actual logical values stored in any latch but rather in being able to repeat the identical initialization patterns each time.

It is not absolutely necessary to initialize the system SRLs as described above. The SRLs will be loaded with a repeatable state from the SRSG on the transmission of the first test pattern. However, if SRLs are not initialized, the non-repeatable state of the SRLs which is set at module power-on will be scanned into the MISR on the first test and will unpredictably affect the final MISR signature. This error could be avoided by turning off all Chip Select lines during the first test scan operation. The easier procedure is to initialize the system SRLs as previously described.

After the initialization patterns are scanned in the SRLs, the module 14 is placed in the self-test mode of operation by the initialization control 66 raising the +Test Mode and the chip select lines to the test chip 10t. Then the shift A and shift B clocks are toggled, starting with shift clock A, for as many cycles as there are SRLs 16 in the longest string on any logic chip on the module. This operation loads each system SRL 16 with new pseudo-random test data and simultaneously scans the previous contents of the scan paths 18 into the MISR. The machine clocks (MCs) are then cycled to capture the test results in the SRLs. Testing continues in this manner until the last test response has been read into the MISR to complete the signature.

The number of test patterns performed and analyzed in this manner must be precisely controlled to guarantee repeatability. One way is to build a counter 76 into the test socket electronics and to stop the test when the counter registers a predetermined number of AB (or machine clock) cycles. An alternative to this is to have an AND gate on the test module 14 that is driven by the individual stages of the SRSG 22 and to stop the test when the state of the SRSG reaches a value which satisfies the AND.

Comparison of the signature remaining in the MISR after the last Scan operation with the predetermined expected signature can be done off-module using the MISR scan capability to unload the final signature into the comparator 68 as described or can be done on-module using an AND gate driven by the stage outputs of the MISR.

Above we have described testing of the circuit module when it is outside the system environment. In the system environment the functions performed by the circuits associated with the module socket can be performed by the system.

Therefore it should be understood that many modifications and changes can be made in the illustrated embodiment without departing from the spirit and scope of the invention as represented in the attached claims.

Having thus described my invention, what I claim as new, and desire to secure by Letters Patent is:

1. In a combinational and sequential logic circuit arranged on a plurality of logic units with memory circuits on each logic unit coupled together to form a shift register which shift register can be enabled to provide a shift register scan path for testing the logic circuit and disabled while the logic circuit is performing its designed logic function, apparatus for performing self-testing of the logic circuit using a multistage generator means to generate testing sequences for the self-testing and a multistage data compression means to compress the response of the logic circuits the improvement comprising:

test circuit unit means containing the multistage random signal generator means for the generation of testing sequences and the multistage data compression means for the compression of the logic signals, circuit means coupling the scan paths of said logic units to said test circuit unit means and, logic means for coupling said shift register scan paths of said logic units in a plurality of parallel shift register paths between different stages of said signal generator means and said multistage data compression means for supplying said testing sequences to said memory circuits in said plurality of parallel paths so the response of said logic circuits is transmitted along said plurality of parallel paths to be compressed by said multistage data compression means for developing a self-test signature.

2. The combination of claim 1 wherein said logic means includes means for connecting said parallel shift register paths into a single shift register scan path including the shift register paths of all the individual logic units.

3. The combination of claim 2 wherein the stages of said multistage random signal generator and said multistage data compression means and said memory circuits are all operated to shift data between them using the same set of shift pulses.

* * * * *